(12) United States Patent  
Engel

(10) Patent No.: US 7,084,804 B1
(45) Date of Patent: Aug. 1, 2006

(54) BACKGROUND CALIBRATION OF PIPELINED ADCS USING FLOW CONTROL

(75) Inventor: Gil Engel, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/180,823

(22) Filed: Jul. 13, 2005

(51) Int. Cl.
H03M 1/34 (2006.01)

(52) U.S. Cl. ........................ 341/162; 341/120
(58) Field of Classification Search ........ 341/120, 341/155–170
See application file for complete search history.

(56) References Cited

U.S. PATENT DOCUMENTS 6,037,891 A * 3/2000 Griph .................. 341/161
6,169,502 B1 * 1/2001 Johnson et al. ........ 341/120
6,340,944 B1 * 1/2002 Chang et al. .......... 341/161

OTHER PUBLICATIONS

J.M. Ingino and B.A. Wooley "A Continuously Calibrated 12-b, 10MS/s, 3.3-V A/D Converter", IEEE Journal of Solid State Circuits, vol. 33, No. 12, Dec. 1998. pp. 1920-1931.
D. Fu, K. C. Dyer, S.H. Lewis and P.J. Hurst, "A Digital Background Calibration Technique fo Time-Interleaved Analog-to-Digital Converters", IEEE Journal of Solid-State Circuits, vol. 33, No. 12, Dec. 1998. pp. 1904-1911.
U.-K. Moon and B.-S. Song, "Background Digital Calibration Techniques for Pipelined ADC's", IEEE Transactions on Circuits and Systems-II: Analog and Digital Signal Processing, vol. 44, Feb. 1997, pp. 102-109.

* cited by examiner

*Primary Examiner*—Lam T. Mai
(74) *Attorney, Agent, or Firm*—Gauthier & Connors LLP

(57) ABSTRACT

A modified pipeline architecture allows the simple implementation of a foreground calibration technique with the continuous calibration benefits of the background calibration techniques. To calibrate a stage in the pipeline, a calibration voltage is presented to the input instead of the output from the previous stage. To prevent loss of information, the output data of the previous stage is passed on to a stage further down.

15 Claims, 10 Drawing Sheets

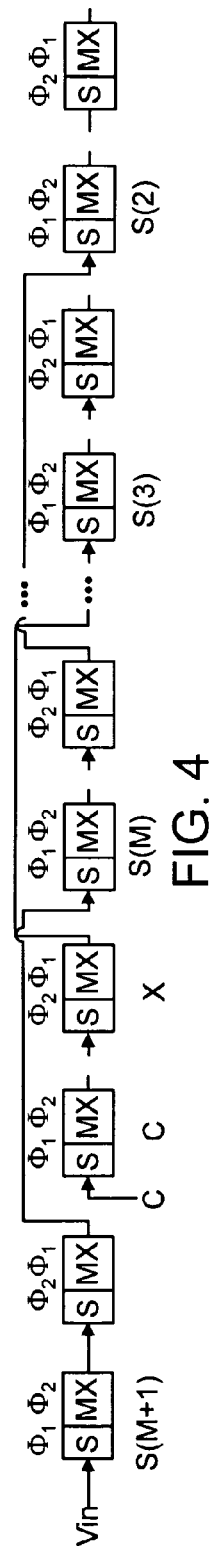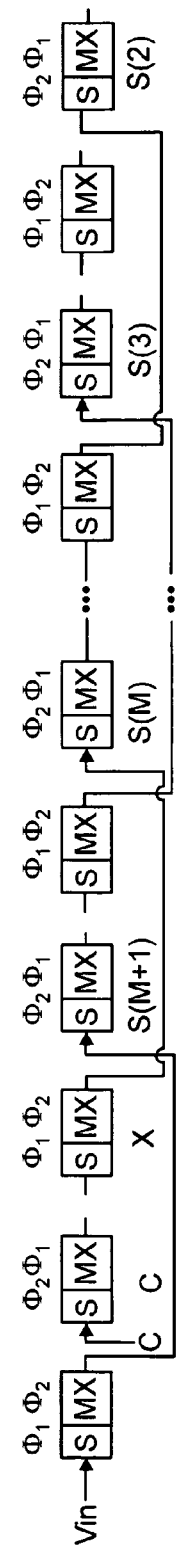

BACKGROUND CALIBRATION OF PIPELINED ADCS USING FLOW CONTROL

BACKGROUND OF THE INVENTION

1. Field of Invention

The present invention relates generally to the field of pipeline analog-to-digital converters. More specifically, the present invention relates to the calibration of pipeline analog-to-digital converters for improved performance.

2. Discussion of Prior Art

Pipeline A/D converters provide a high resolution and high throughput without the exponential scaling of flash converters. Each stage within the pipeline samples an analog input value, produces a k-bit decision, adjusts and multiplies the input value to produce a residue to the following stage. The complete Analog-to-Digital Converter (ADC) word appears at the output once the input sample has propagated through all of the stages in the pipeline. Typically, a pipeline converter operates in two phases; a sampling phase, and a multiply phase. During the sampling phase an analog input value is stored and a k-bit decision is produced. During the multiply phase, a stage outputs an adjusted analog sample, called a residue, to the following stage that conversely will be in the sampling phase. A conventional pipeline ADC is shown in FIG. 1. The input voltage is sampled by the first stage during phase one ($\Phi_1$). During phase two ($\Phi_2$) the input just sampled is multiplied and adjusted by a multiple of the reference voltage (VREF) to produce a residue. The following stage samples the residue, generated by first stage, during $\Phi_2$ and performs the multiplication and subtraction during $\Phi_1$. Each stage in the pipeline processes the residue presented by the previous stage generating k-bits until the input sample has propagated through all of the stages in the pipeline. Bits generated by each stage in the pipeline are captured, shifted and aligned by simple digital latches producing a digital output word. The maximum error must be less than a least significant bit (LSB) for linear operation.

Within each stage, capacitor mismatch causes the gain to vary from the ideal desired multiple. These mismatches can result in missing codes or missing decision levels. Circuit performance is also affected by the amplifiers finite open-loop gain. The limited gain of the amplifier causes the output not to reach its final value. The effects of capacitor mismatch and amplifier gain, in the simple 1-bit per stage case, can be estimated by the following expression:

$$Vo = Vi \cdot \frac{C_1}{C_2} \cdot \frac{1 + C_1/C_2}{1 + \frac{1 + C_1/C_2}{A}} + Vref \cdot (-1)^{b_i} \frac{1}{1 + \frac{1 + C_1/C_2}{A}}$$

In addition to capacitor mismatch and insufficient amplifier open-loop gain, errors can also be introduced by switch charge injection, comparator offset and amplifier offset. However, circuit and clocking techniques have been developed to compensate for these errors.

Calibration of pipeline A/D converters have been addressed in the prior art before. They fall into two categories: foreground calibration and background calibration. Foreground calibration methods require the converter to halt operation during the calibration period. Background calibration methods can operate while the converter continues to sample.

Circuit techniques also exist for handling these errors. A reference refreshing technique presented in the paper to Shih et al. entitled, "Reference Refreshing Cyclic Analog-to-Digital and Digital-to-Analog Converters," compensates for the loop gain in a cyclic A/D converter. A capacitor charge transfer technique as described in the paper to Li et al. entitled, "A Ratio Independent Algorithmic Analog-to-Digital Conversion Technique," compensates for capacitor mismatch in a cyclic A/D converter. A double correlated sampling technique as presented in the paper to Li et al. entitled, "A 1.8V 67 mW 10b 100MS/s pipelined ADC using Time-Shifted CDS technique," corrects finite amplifier open-loop gain with minimal overhead in a pipeline A/D converter. These methods use additional cycles to perform their correction. Another method as presented in the paper to Yu et al. entitled, "A 2.5V, 12-b, 5MS/s Pipelined CMOS ADC", commutates the capacitors to minimize the DNL.

To maintain optimum performance in pipeline analog-to-digital converters, calibration methods have been developed that correct for errors introduced by capacitor mismatch and limited amplifier open-loop gain. The calibration method presented in the paper to Karanicolas et al. entitled "A 15-b, 1-MS/s Digitally Self-Calibrated Pipelined ADC," uses a 1.93 radix per stage to eliminate missing decision level errors and is digitally calibrated off-line. This is a foreground calibration technique; and this circuit requires an amplifier with sufficient open-loop gain, because the amplifier gain can vary during normal operation due to thermal conditions. The one-time calibration compensates well for capacitor mismatch but will not track variations during normal operation.

The calibration method described in the paper to Moon et al. entitled, "Background Digital Calibration Techniques for Pipelined ADC's," uses a background calibration technique called skip-and-fill. This technique inserts a calibration voltage into the pipeline without halting the normal flow. However, this requires a reconstruction filter to recover the missing data; the reconstruction filter is a nonlinear interpolator and will introduce bandwidth limitations. However, such prior art calibration techniques fail to teach continuous calibration of pipelined ADCs without loss of data.

The technique described in the paper to Ingino et al. entitled, "A Continuously Calibrated 12-b, 10MS/s, 3.3-V A/D Converter," is capable of continuously operating while performing a background calibration. However, the stage being calibrated is taken offline resulting in a non-optimum calibration. Also, the additional switches make this method impractical for a large number of stages.

The technique as described in the paper to Fu et al. entitled, "A Digital Background Calibration Technique for Time-Interleaved Analog-to-Digital Converters," uses time-interleaving to switch between completely separate converters. Fu's method requires a complete duplication of ADC's to perform calibration on pipelines that are currently not in use.

The method described in the paper to Murmann et al. entitled, "A 12-bit 75-MS/s Pipelined ADC Using Open-Loop Residue Amplification," implements correction using statistical data gathering to correct the output data.

The prior art methods described above are limited in their scope and effectiveness. The foreground technique cannot function while the converter is sampling and, therefore, does not track the continuously changing operating conditions. The background techniques available today use complex non-ideal digital reconstruction, a great deal of overhead, or deficient calibration. Hence, the prior art solutions fail to teach a background calibration circuit that allows optimal background calibration of pipeline A/D converters. Furthermore, prior art solutions fail to teach a circuit that continuously compensates for capacitor mismatch and provides finite amplifier gain with minimal complexity and without the loss of any samples.

Whatever the precise merits, features, and advantages of the above cited references, none of them achieves or fulfills the purposes of the present invention.

SUMMARY OF THE INVENTION

The present invention provides for a pipeline analog-to-digital converter architecture comprising a plurality of normal pipeline stages for normal operation flow of residues in the analog-to-digital converter, and a plurality of bypass switches operating in conjunction with the plurality of normal pipeline stages shifting residues wherein, upon insertion of a calibration value into a normal pipeline stage, the bypass switches selectively operate to extend the normal pipeline stages and alter shifting of residues in the pipeline stages to accommodate the introduction of the calibration value, thereby allowing continuous calibration without loss of samples.

The present invention also provides for a modified pipeline analog-to-digital converter architecture accommodating background calibration without loss of samples. In this embodiment, the modified analog-to-digital converter architecture comprises one or more extended pipeline stages and a plurality of bypass switches. The extended pipeline stages are implemented in conjunction with a set of normal pipeline stages, wherein the normal pipeline stages shift residues as in a normal pipeline analog-to-digital converter. The plurality of bypass switches operate in conjunction with the normal pipeline stages and the extended pipeline stage to alter the shifting of residues in the analog-to-digital converter architecture to implement calibration of a pipeline stage, wherein the bypass switches are selectively operational during the introduction of a calibration value into a normal pipeline stage to allow output of a normal pipeline stage to shift by at least one pipeline stage to accommodate the introduction of the calibration value, thereby allowing continuous calibration of the modified pipeline analog-to-digital converter without loss of samples.

BRIEF DESCRIPTION OF THE DRAWINGS

FIG. 4 illustrates modified flow though the present invention's pipeline analog-to-digital converter during a $\Phi_1$ calibration insertion.

FIG. 5 illustrates modified flow though the present invention's pipeline analog-to-digital converter during a $\Phi_2$ calibration insertion.

DESCRIPTION OF THE PREFERRED EMBODIMENTS

Figure 1:
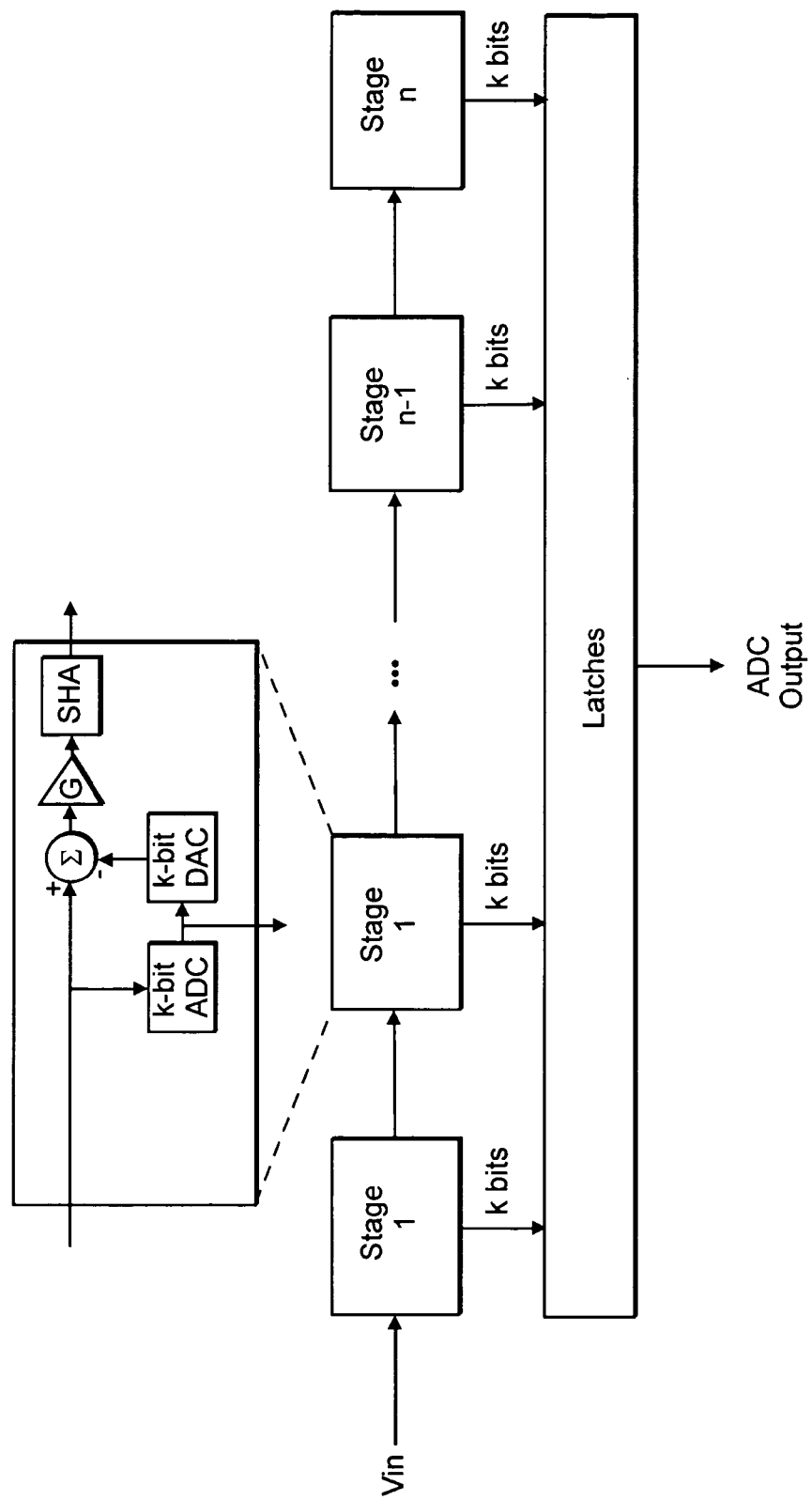
FIG. 1 illustrates a block diagram of a prior art analog-to-digital converter.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

The present invention provides for a modified pipeline architecture that provides the benefits of background calibration using the simple implementation of a foreground calibration technique. Specifically, the present invention provides for a pipeline analog-to-digital converter architecture comprising a plurality of normal pipeline stages for normal operation flow of residues in the analog-to-digital converter, and a plurality of bypass switches operating in conjunction with the plurality of normal pipeline stages shifting residues wherein, upon insertion of a calibration value into a normal pipeline stage, the bypass switches selectively operate to extend the normal pipeline stages and alter shifting of residues in the pipeline stages to accommodate the introduction of the calibration value, thereby allowing continuous calibration without loss of samples.

Figure 2:
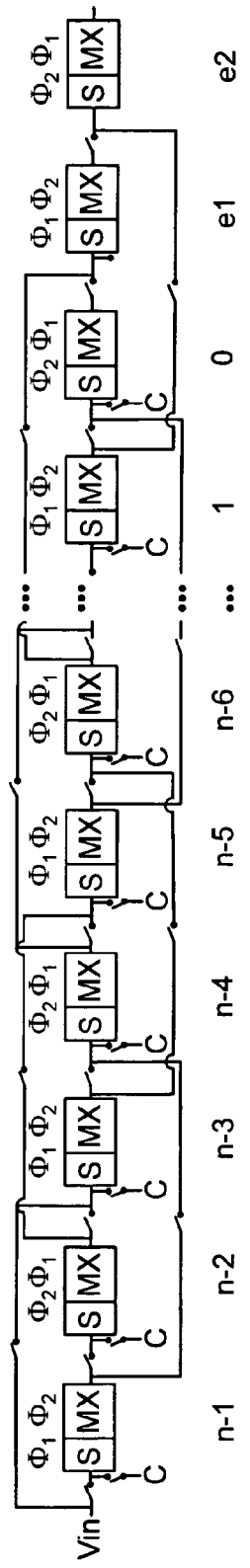
FIG. 2 illustrates the present invention's modified pipeline analog-to-digital converter.

Each stage in a pipeline A/D operates on alternating phases, $\Phi_1$ or $\Phi_2$. To calibrate a stage in the pipeline, a calibration voltage needs to be presented to the input instead of the residue output from the previous stage. To prevent loss of information, the output residue of the previous stage must be passed on to a stage further down. However, since phases alternate, the residue must skip two stages. FIG. 2 illustrates a modified structure of a pipeline analog-to-digital converter as per an exemplary embodiment of the present invention.

A stage sampling on $\Phi_1$, such as stage 1, will be referred to as a $\Phi_1$ stage, and a stage sampling on the $\Phi_2$ stage, such as stage 0, will be referred to as a $\Phi_2$ stage. Each stage below the stage being calibrated must skip two stages so that no information is lost. This requires the addition of a single $\Phi_1$ stage and a single $\Phi_2$ stage to the end of the pipeline. During the normal operating flow the extended stages are not used, and data is simply truncated to the most significant bits of interest. During a calibration cycle samples that skip stages need to be processed an additional time, and the extended stages come into play.

EXAMPLE 8 bit pipeline A/D converter

| Stage: | 8 | 7 | 6 | 5 | 4 | 3 | 2 | 1 | e1 | e2 |
|---|---|---|---|---|---|---|---|---|---|---|
| Residue Sample #4 After $\Phi_2$ | | s4 | | s3 | | s2 | | s1 | xx | xx |
| Input Sample #5 After $\Phi_1$ | s5 | | s4 | | s3 | | s2 | | xx | xx |

-continued

| Stage: | 8 | 7 | 6 | 5 | 4 | 3 | 2 | 1 | e1 | e2 |
|---|---|---|---|---|---|---|---|---|---|---|
| Sample & Cal Stage 7 After $\Phi_2$ | | C | | s5 | | s4 | | s3 | | s2 |

Where:
s#: residue of sample number
xx: don't care
C: Calibration voltage

It should be noted that the residue of sample #2 (s2) needs to be processed an additional eighth time and utilizes the extra $\Phi_2$ stage e2. The next sample will follow normal operating flow.

Figure 3:
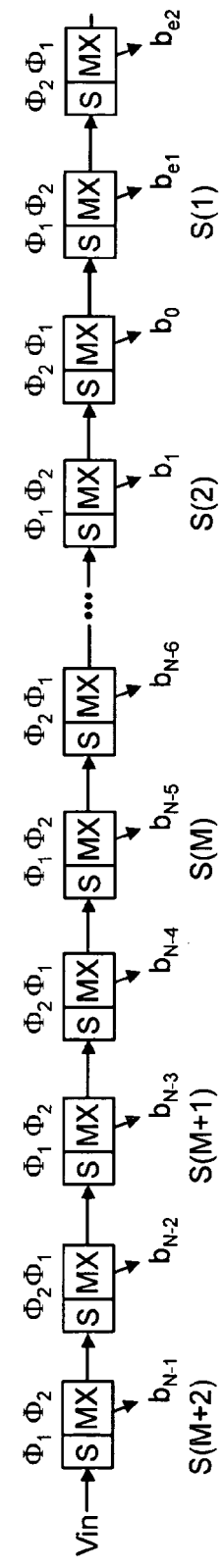
FIG. 3 illustrates normal flow through the present invention's modified pipeline analog-to-digital converter.

FIG. 3 illustrates the pipeline during normal operating flow. Residues propagate through the pipeline in a sequential manner.

In order to calibrate a stage, the other phase must complete its cycle. Once the other phase has completed its cycle, all information of interest through all stages in the pipeline is in the same phase as the stage being calibrated. All switches further down the pipe associated with the correct phase are enabled. FIGS. 4 and 5 show the modified flow for a $\Phi_1$ and $\Phi_2$ calibration, respectively.

Figure 6A:
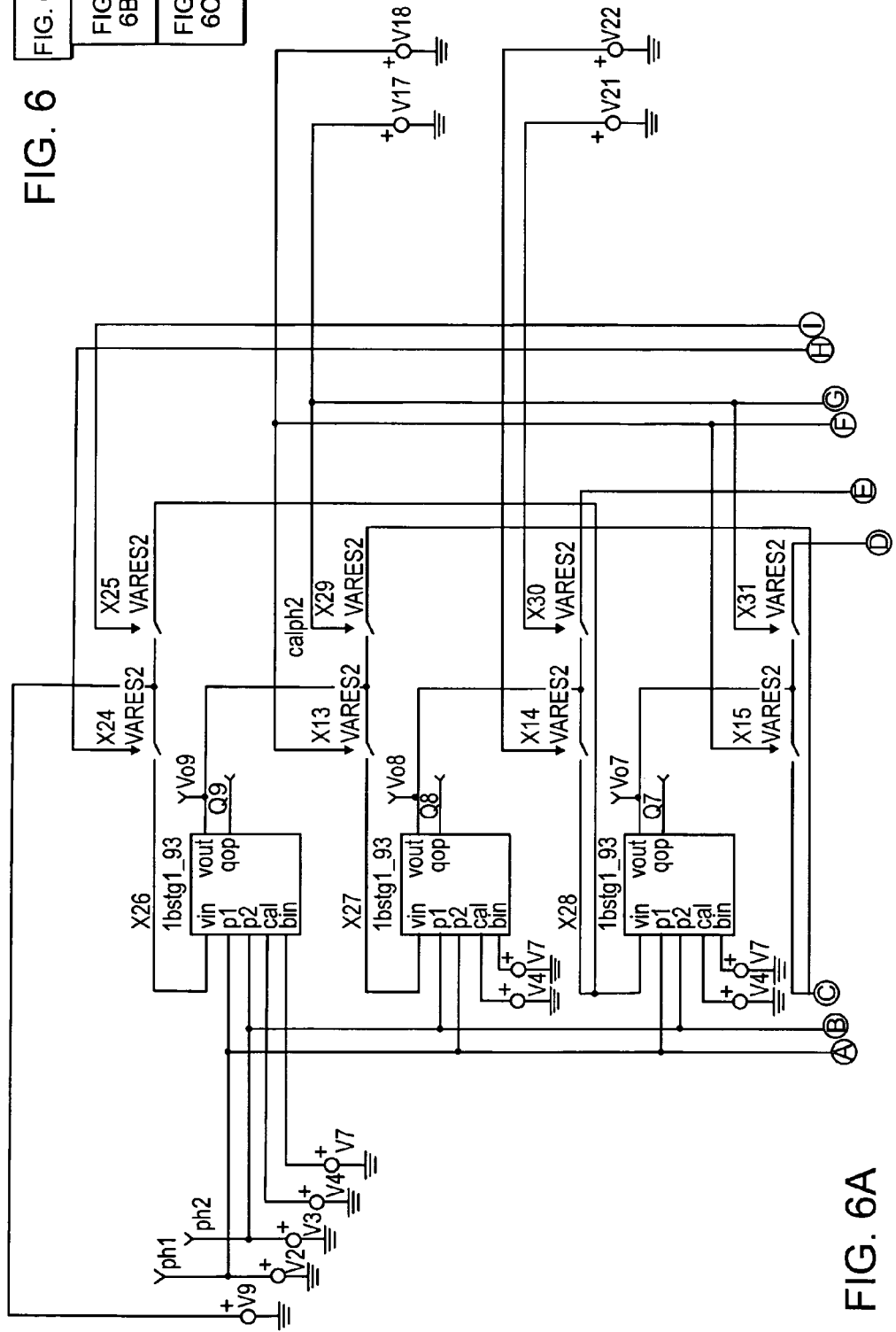
FIG. 6 illustrates a top level schematic comprising twelve stages, six ideal and six non-ideal.
Figure 6B:
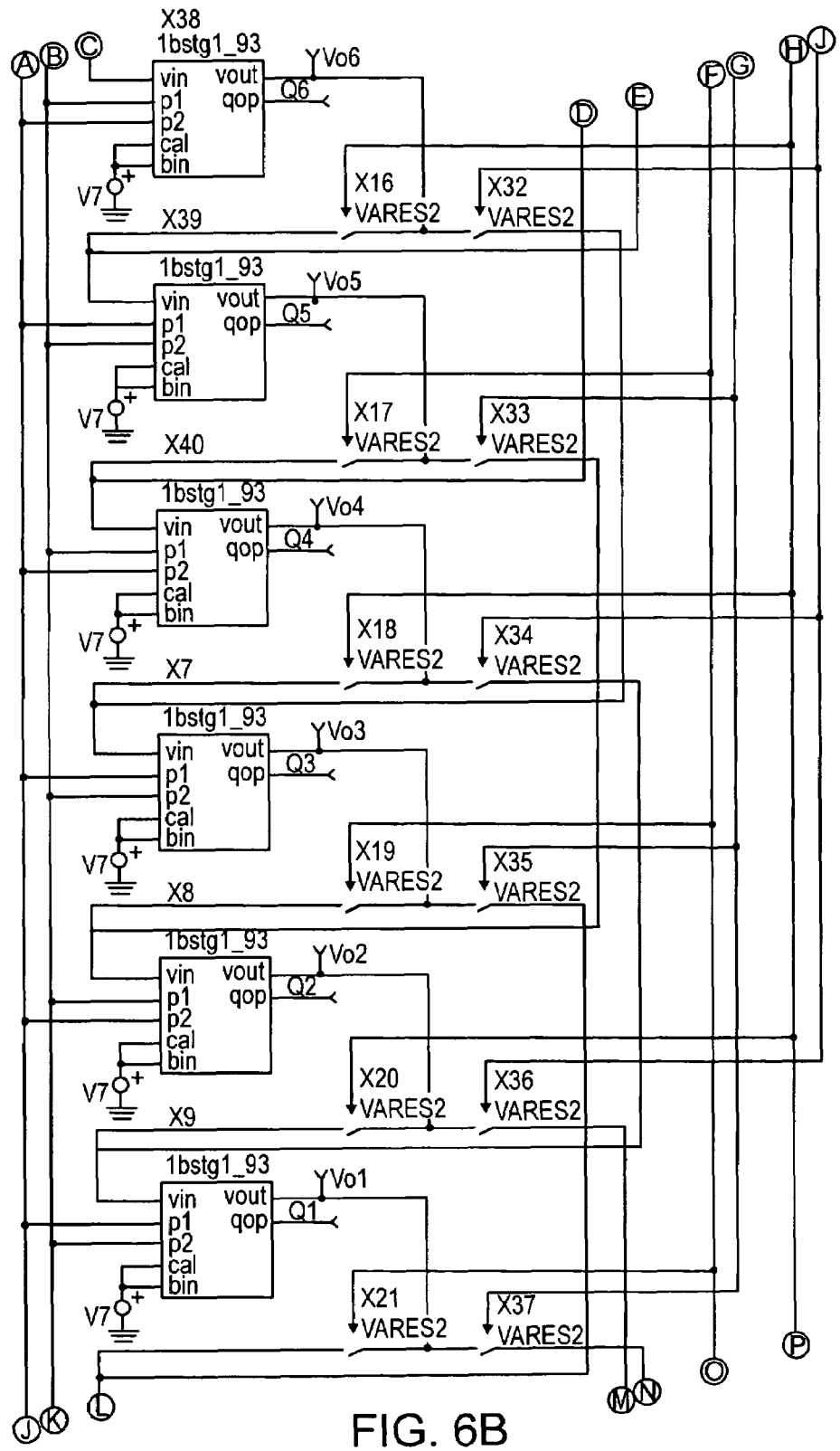
Figure 6C:
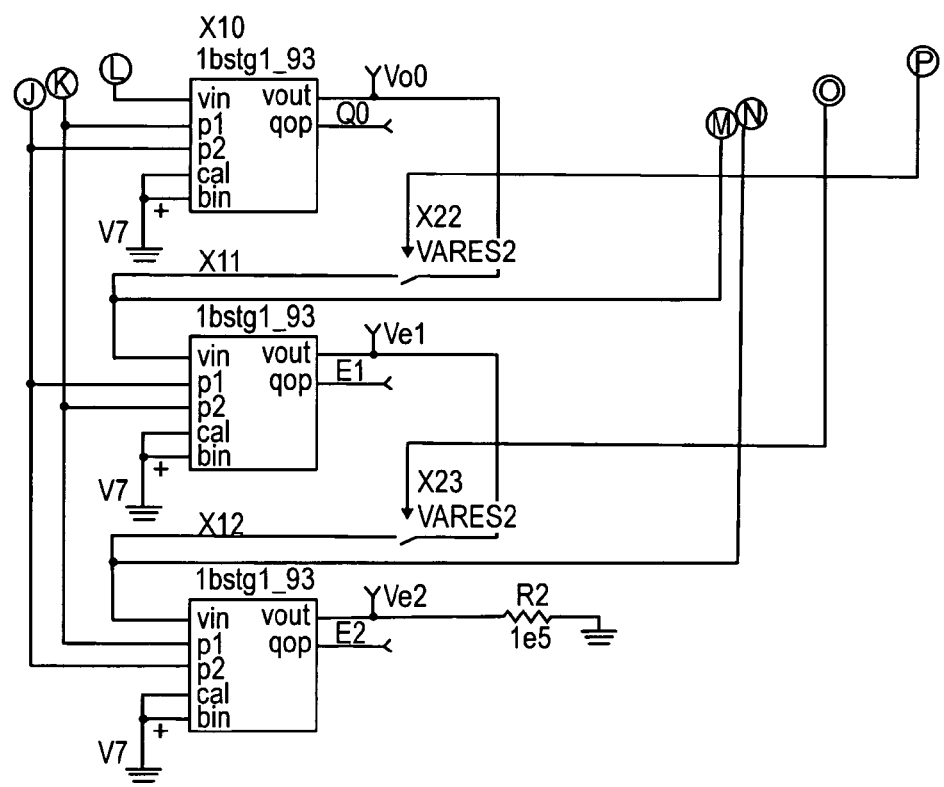

As an example of the implementation of the continuous calibration technique, a 1-bit per stage pipeline is described. However, it should be noted that the correction technique described works just as effectively in a multi-bit architecture described without the need to implement a nonlinear interpolation filter. FIG. 6 illustrates a top level schematic used in a sample simulation wherein the setup includes twelve stages: six ideal and six non-ideal. In this sample simulation, the pipeline ADC simulated contains twelve stages, ten plus an extended $\Phi_1$ and $\Phi_2$ stage. The first six stages contain a 1.93 radix multiplication while the remaining stages use the standard 2× multiplication with the modifications described above.

The full converter was simulated with the first six stages having non-idealities and the last six as ideal with a 2× capacitor matching and high op-amp gain. FIG. 6 shows the complete top level schematic for the converter. Each stage is fed a pair of non-overlapping clocks, $\Phi_1$ and $\Phi_2$ as shown in FIG. 5. In addition to these clocks, the stages are fed a third clock signal which enables calibration in the stage. Each block has a voltage input, voltage output, a bit output, a calibration enable input and a bit input. Voltages are supplied in the block itself.

Figure 7:
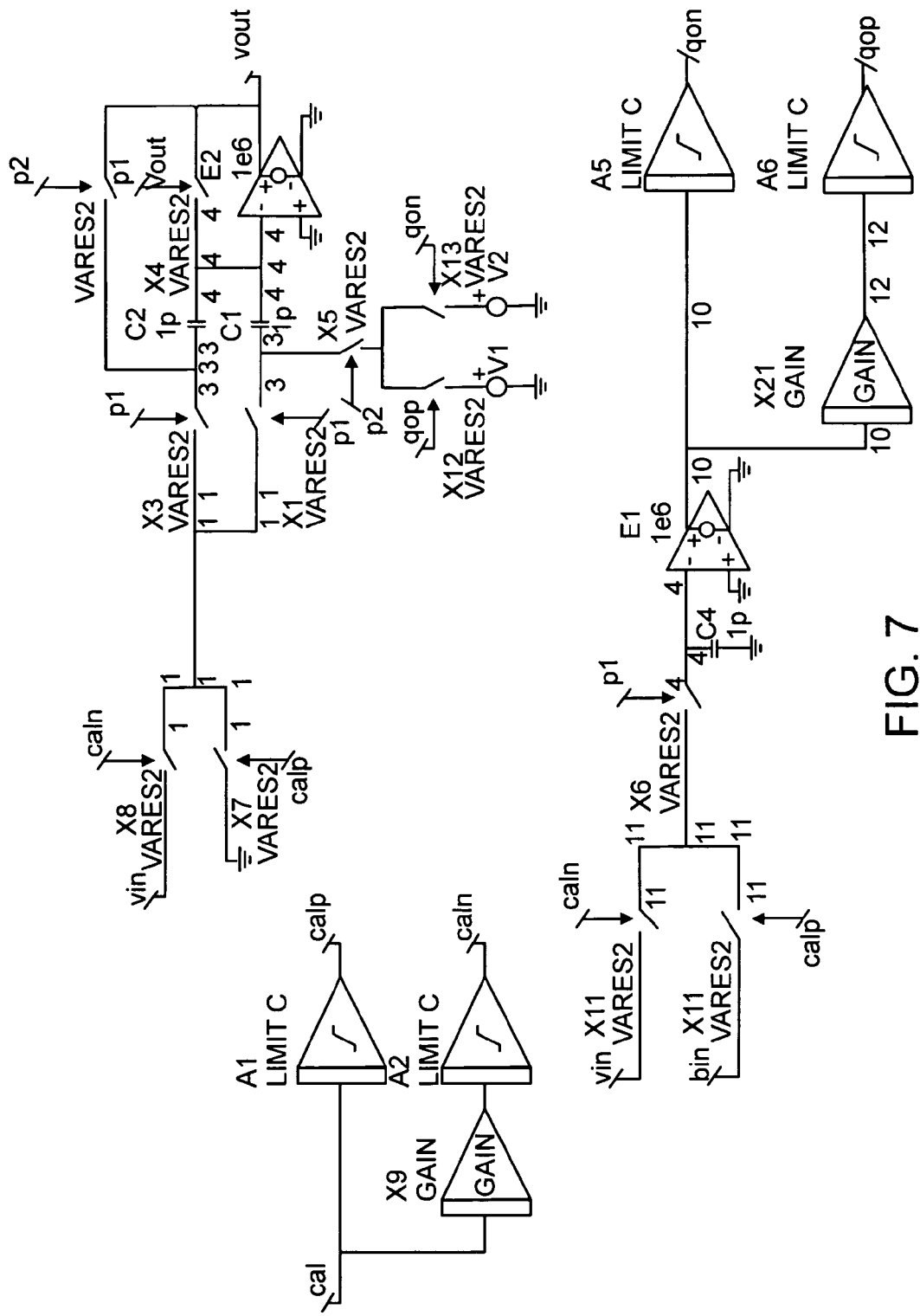
FIG. 7 illustrates an ideal stage as implemented in the schematic of FIG. 6.

The ideal stage is shown in FIG. 7. Each stage takes an input voltage between −0.5V and 0.5V and compares it to 0V. The comparator is modeled as ideal using SPICE behavioral blocks to generate 0 and 2 corresponding to a logic 0 and 1, respectively. The same circuitry is repeated for the bit input. The "cal" input signal will select between the voltage in or the reference ground and bit inputs.

Figure 8:
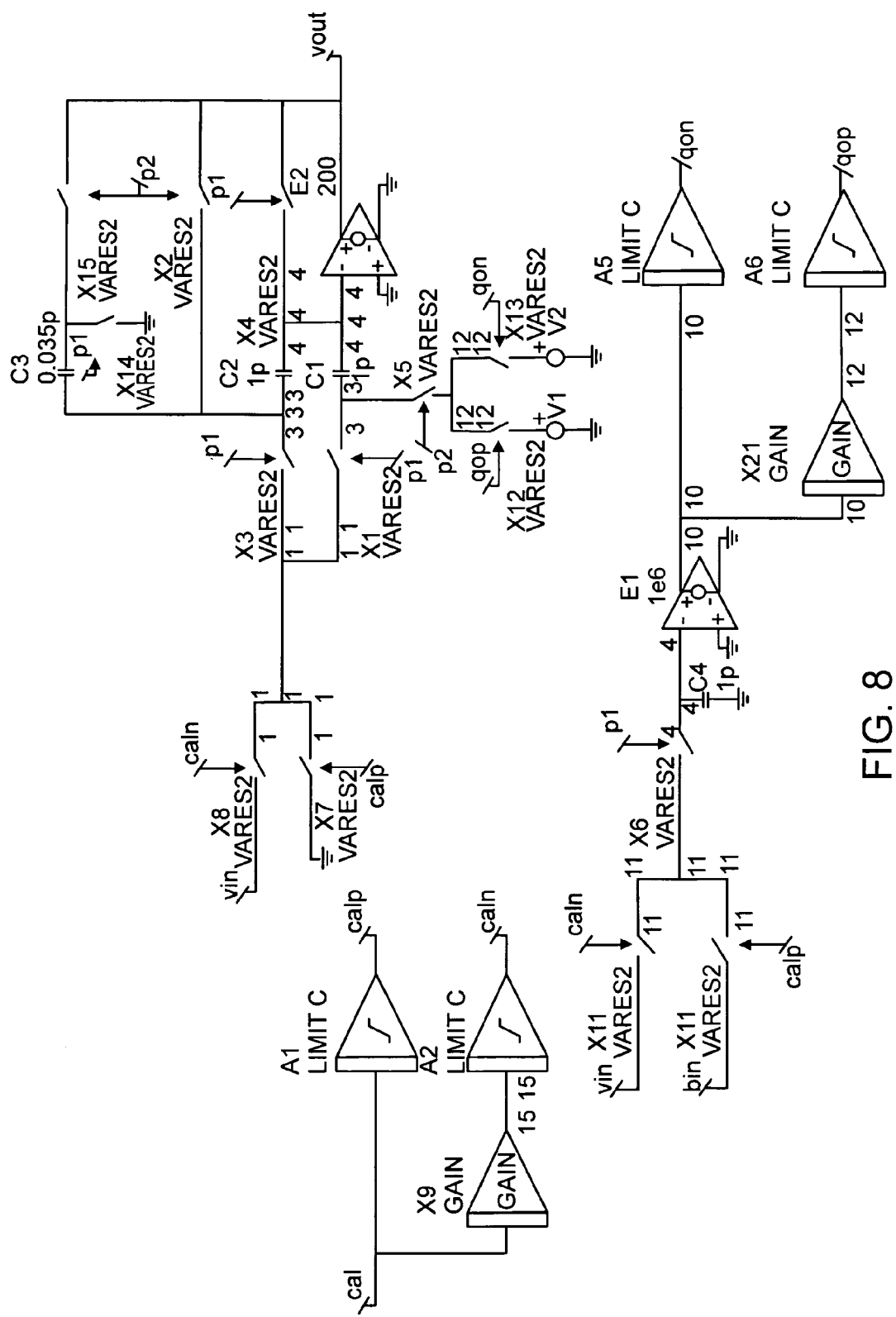
FIG. 8 illustrates a non-ideal stage as implemented in the schematic of FIG. 6.

The non-ideal block includes op-amp with a limited gain of 200. An additional capacitor of 35fF was incorporated to implement the 1.93 multiplication. The non-ideal block is shown in FIG. 8.

Figure 9:
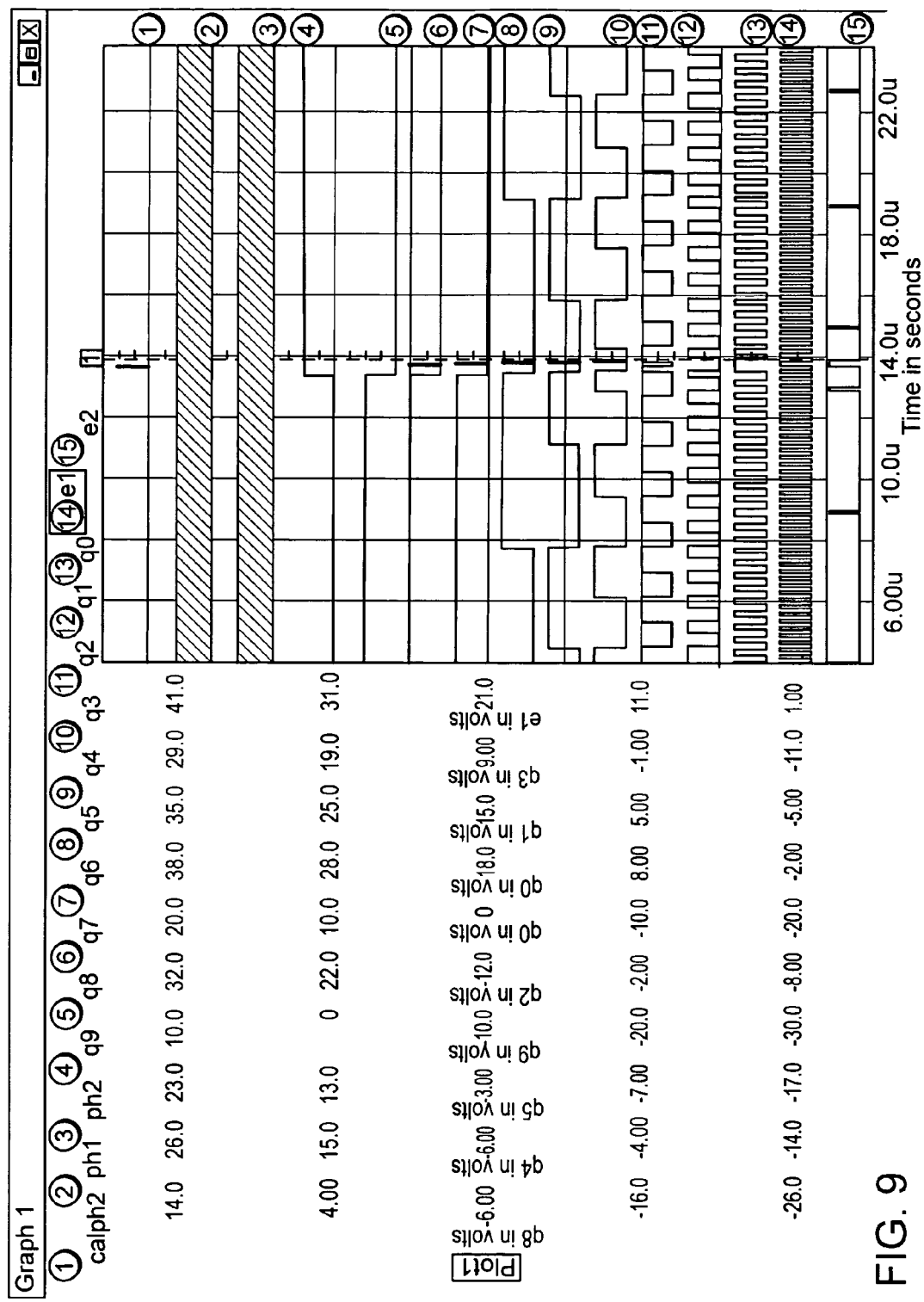
FIG. 9 illustrates a ramp input to the converter.
Figure 10:
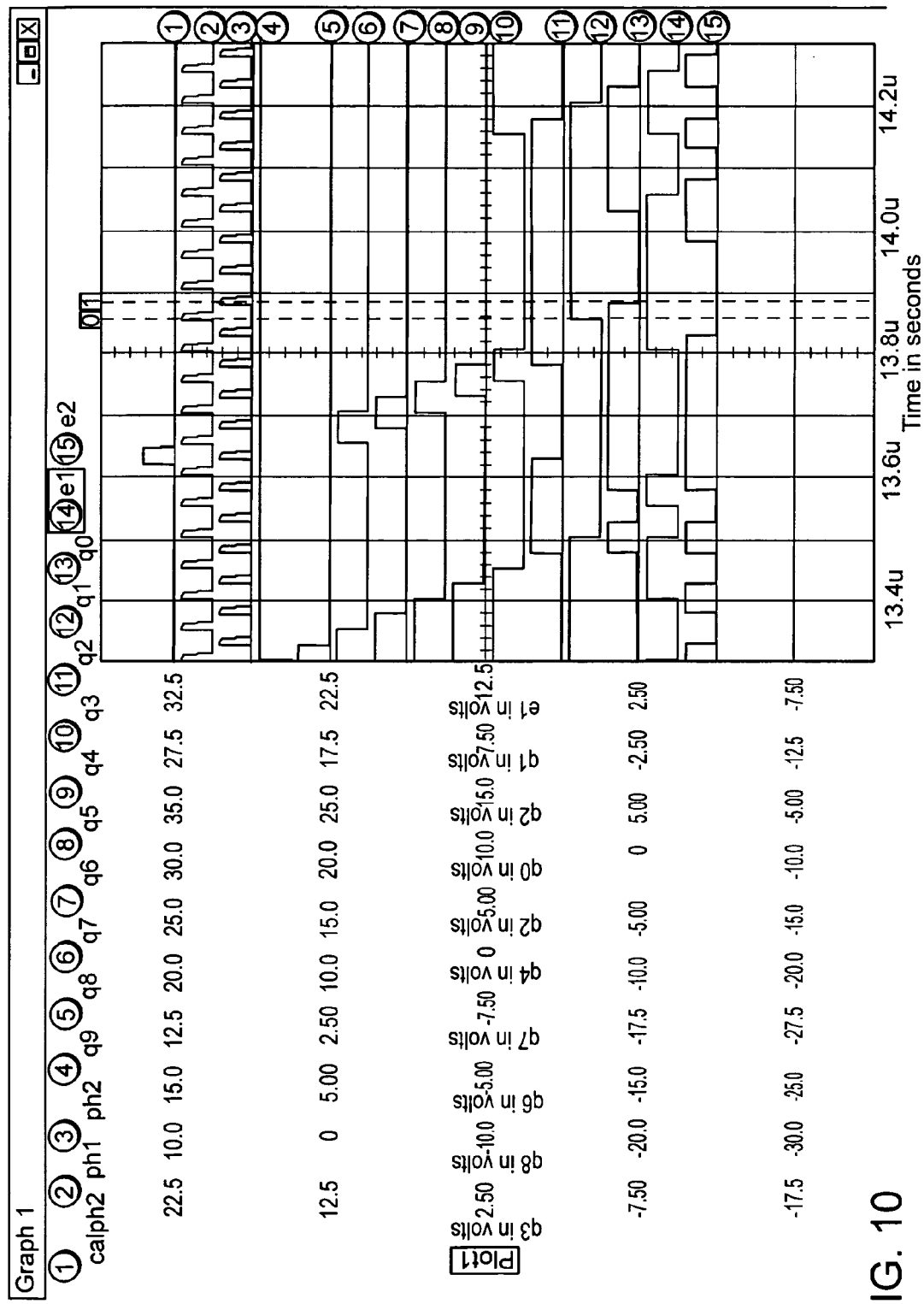
FIG. 10 illustrates a magnified view during calibration phase.

The simulation sweeps the voltage input to the ADC from −0.5 to 0.5 to generate the count pattern shown in FIG. 9. In midstream, a calibration of the b8 stage is enabled. A feature of the calibration technique is the ability to calibrate the converter without missing a sample. A magnified picture during the calibration phase shows the propagation of the calibration output bits. Note that e1 and e2 stages are utilized. The flow continues normally once the calibration input has gone through the pipeline FIG. 10. The resulting calibration sequence is 01111110110 and matches the calibration constants taken offline listed in Table 1. This calibration constant will be used by the digital calibration logic to apply corrections.

TABLE 1

Table of calibration sequences, for MSB stages of converter, to be used by digital calibration logic

| Stage | Cal Sequence |
|---|---|
| b9-bin = 0 | 011111101100 |
| bin = 1 | 100000010011 |
| b8-bin = 0 | 01111110110 |
| bin = 1 | 10000001001 |
| b7-bin = 0 | 0111111011 |
| bin = 1 | 1000000100 |
| b6-bin = 0 | 011111101 |
| bin = 1 | 100000010 |
| b5-bin = 0 | 01111111 |
| bin = 1 | 100000000 |
| b4-bin = 0 | 01111111 |
| bin = 1 | 10000000 |

Hence, the present invention provides for a modified pipeline analog-to-digital converter architecture accommodating background calibration without loss of samples. In this embodiment, the modified analog-to-digital converter architecture comprises one or more extended pipeline stages and a plurality of bypass switches. The extended pipeline stages are implemented in conjunction with a set of normal pipeline stages, wherein the normal pipeline stages shift residues as in a normal pipeline analog-to-digital converter. The plurality of bypass switches operate in conjunction with the normal pipeline stages and the extended pipeline stage to alter the shifting of residues in the analog-to-digital converter architecture to implement calibration of a pipeline stage, wherein the bypass switches are selectively operational during the introduction of a calibration value into a normal pipeline stage to allow output of a normal pipeline stage to shift by at least one pipeline stage to accommodate the introduction of the calibration value, thereby allowing continuous calibration of the modified pipeline analog-to-digital converter without loss of samples.

The present invention also provides for an integrated circuit implementing a modified analog-to digital converter architecture accommodating background calibration and continuous compensation for capacitor mismatch and finite amplifier gain with minimal complexity and without loss of samples, wherein the integrated circuit comprises: (a) a first circuit component implementing a plurality of normal pipeline stages for normal operation by shifting residues in the analog-to-digital converter; (b) a second circuit component extending the pipeline stages for continuous calibration; and (c) a third circuit component implementing a plurality of bypass switches operating in conjunction with the first and second circuit components to alter the shifting of residues in the analog-to-digital converter architecture during calibration of a normal pipeline stage, wherein the bypass switches selectively operate during calibration of a normal pipeline stage to accommodate the introduction of the calibration value and allowing continuous calibration. The first, second, and third integrated circuit components allow continuous calibration of said pipeline analog-to-digital converter without loss of samples.

CONCLUSION

A system and method has been shown in the above embodiments for the effective implementation of a background calibration of pipelined ADCs using flow control. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by software/program, computing environment, or specific computing hardware.

The invention claimed is:

1. A pipeline analog-to-digital converter architecture sampling analog data comprising:
   a plurality of normal pipeline stages for normal operation flow of residues in said analog-to-digital converter; and
   a plurality of bypass switches operating in conjunction with said plurality of normal pipeline stages shifting residues and, upon insertion of a calibration value into a normal pipeline stage, said bypass switches selectively operating to extend said normal pipeline stages and altering shifting of residues in said pipeline stages to accommodate the introduction of said calibration value, thereby allowing continuous calibration without loss of samples.

2. A pipeline analog-to-digital converter architecture sampling analog data, as per claim 1, wherein said architecture outputs 1 bit per pipeline stage.

3. A pipeline analog-to-digital converter architecture sampling analog data, as per claim 1, wherein said architecture outputs multiple bits per pipeline stage.

4. A modified pipeline analog-to-digital converter architecture accommodating background calibration without loss of samples, said modified analog-to-digital converter architecture comprising:
   one or more extended pipeline stages implemented in conjunction with a set of normal pipeline stages, said normal pipeline stages shifting residue as in a normal pipeline analog-to-digital converter;
   a plurality of bypass switches operating in conjunction with said normal pipeline stages and said at least one extended pipeline stage to alter said shifting of residues in said analog-to-digital converter architecture to implement calibration of a pipeline stage, said bypass switches selectively operational during introduction of a calibration value and into a normal pipeline stage to allow output of a normal pipeline stage to shift by at least one pipeline stage to accommodate the introduction of said calibration value, thereby allowing calibration without loss of samples;
   said one or more pipeline stages accommodating said calibration value and allowing continuous calibration of said modified pipeline analog-to-digital converter without loss of samples.

5. A modified pipeline analog-to-digital converter architecture accommodating background calibration without loss of samples, as per claim 4, wherein said modified pipeline analog-to-digital converter architecture outputs 1 bit per pipeline stage.

6. A modified pipeline analog-to-digital converter architecture accommodating background calibration without loss of samples, as per claim 4, wherein said modified pipeline analog-to-digital converter architecture outputs multiple bits per pipeline stage.

7. A synchronous method to perform background calibration of a pipeline stage among a set of normal pipeline stages in a pipeline analog-to-digital converter, said pipeline stages shifting residues as in a normal analog-to-digital converter during normal operation, said method comprising:
   a. introducing a calibration value into a normal pipeline stage; and
   b. selectively enabling a plurality of switches working in conjunction with said normal pipeline stages and at least one extended pipeline stage to alter shifting of said residues in said analog-to-digital converter to accommodate the introduction of said calibration value, thereby allowing calibration of said analog-to-digital converter without loss of samples.

8. A synchronous method to perform background calibration of a pipeline stage among a set of normal pipeline stages in a pipeline analog-to-digital converter, said pipeline stages shifting residues as in a normal analog-to-digital converter during normal operation, as per claim 7, wherein said pipeline analog-to-digital converter outputs 1 bit per pipeline stage.

9. A synchronous method to perform background calibration of a pipeline stage among a set of normal pipeline stages in a pipeline analog-to-digital converter, said pipeline stages shifting residues as in a normal analog-to-digital converter during normal operation, as per claim 7, wherein said pipeline analog-to-digital converter outputs multiple bits per pipeline stage.

10. An integrated circuit implementing a modified analog-to digital converter architecture accommodating background calibration and continuous compensation for capacitor mismatch and finite amplifier gain with minimal complexity and without loss of samples, said modified analog-to-digital converter architecture comprising:
    a first circuit component implementing a plurality of normal pipeline stages for normal operation by shifting residues in said analog-to-digital converter;
    a second circuit component extending said pipeline stages for continuous calibration;
    a third circuit component implementing a plurality of bypass switches operating in conjunction with said first and second circuit components to alter said shifting of residues in said analog-to-digital converter architecture during calibration of a normal pipeline stage, said bypass switches selectively operational during calibration of a normal pipeline stage to accommodate the introduction of said calibration value, thereby allowing continuous calibration; and
    wherein said first, second, and third integrated circuit components allow continuous calibration of said pipeline analog-to-digital converter without loss of samples.

11. An integrated circuit implementing a modified analog-to digital converter architecture accommodating background calibration and continuous compensation for capacitor mismatch and finite amplifier gain with minimal complexity and without loss of samples, as per claim 10, wherein said integrated circuit outputs 1 bit per pipeline stage.

12. An integrated circuit implementing a modified analog-to digital converter architecture accommodating background calibration and continuous compensation for capacitor mismatch and finite amplifier gain with minimal complexity and without loss of samples, as per claim 10, wherein said integrated circuit outputs multiple bit per pipeline stage.

13. A pipeline analog-to-digital converter architecture sampling analog data comprising:

a plurality of normal pipeline stages for normal operation flow of residues in said analog-to-digital converter and at least two extended pipeline stages for continuous calibration;

a plurality of bypass switches operating in conjunction with said plurality of normal pipeline stages and said at least two extended pipeline stages to alter shifting of residues in said analog-to-digital converter architecture to implement calibration of a pipeline stage, said bypass switches selectively operational during calibration of a normal pipeline stage to allow output of a normal pipeline stage preceding said calibrated pipeline stage and each normal pipeline stage between said calibrated normal pipeline stage and the penultimate normal pipeline stage to skip at least two pipeline stages and, after calibration, said bypass switches selectively operational to resume normal flow of residues, thereby allowing calibration without loss of samples;

said at least two extended pipeline stages accommodating at least one skipped pipeline stage, and wherein said plurality of bypass switches, said plurality of pipeline stages, and said at least two extended stages allow continuous calibration of said pipeline analog-to-digital converter without loss of samples.

14. A pipeline analog-to-digital converter architecture sampling analog data, as per claim 13, wherein said architecture outputs 1 bit per pipeline stage.

15. A pipeline analog-to-digital converter architecture sampling analog data, as per claim 13, wherein said architecture outputs multiple bits per pipeline stage.

* * * * *